(12) United States Patent
Luff (10) Patent No.: US 8,120,424 B2
(45) Date of Patent: Feb. 21, 2012

(54) CLASS AB OUTPUT STAGES AND AMPLIFIERS INCLUDING CLASS AB OUTPUT STAGES

(75) Inventor: Gwilym Francis Luff, Great Shelford (GB)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/954,169

(22) Filed: Nov. 24, 2010

(65) Prior Publication Data

US 2011/0304393 A1 Dec. 15, 2011

Related U.S. Application Data (60) Provisional application No. 61/355,026, filed on Jun. 15, 2010, provisional application No. 61/381,881, filed on Sep. 10, 2010.

(51) Int. Cl.
H03F 3/45 (2006.01)
(52) U.S. Cl. .......................................... 330/252; 330/295
(58) Field of Classification Search .............. 330/124 R, 330/295, 252, 311
See application file for complete search history.

(56) References Cited

U.S. PATENT DOCUMENTS

| | | | |
|---|---|---|---|
| 2,358,428 A | | 9/1944 | White |
| 3,896,393 A | * | 7/1975 | Cave et al. ..................... 330/268 |
| 4,573,021 A | * | 2/1986 | Widlar .......................... 330/273 |
| 4,791,383 A | * | 12/1988 | Monticelli et al. ............. 330/265 |
| 5,442,320 A | * | 8/1995 | Kunst et al. .................... 330/267 |
| 5,825,228 A | * | 10/1998 | Gross ............................ 327/333 |

OTHER PUBLICATIONS

Carvajal et al., "The Flipped Voltage Follower: A Useful Cell for Low-Voltage Low-Power Circuit Design," IEEE trans on Circuits Design I, vol. 52, No. 7, pp. 1276-1291, Jul. 2005.
Broksie, "Derivation of the Tradeoff Between Output Resistance and Drive Capability for a White Follower," http://www.tubecad.com/october99/page4.html, Oct. 1999, 1 page.
Jost, "An 850MHz Current Feedback Operational Amplifier," IEEE BCTM, 1992, pp. 71-74.

* cited by examiner

*Primary Examiner* — Henry Choe
(74) *Attorney, Agent, or Firm* — Fliesler Meyer LLP (57) ABSTRACT

A buffer stage includes a flipped voltage follower and an emitter follower. The flipped voltage follower is connected between a high voltage rail and a low voltage rail and include an input and an output. The emitter follower is also connected between the high voltage rail and the low voltage rail and includes an input and an output. A resistor connects the output of the flipped voltage follower to the output of the emitter follower. The input of the flipped voltage follower and the input of the emitter follower are connected together and provide an input of the buffer stage. The output of the emitter follower provides an output of the buffer stage. A differential buffer stage can be implemented using a pair of such buffer stages. Such a differential buffer stage can provide the output stage for a fully differential operational amplifier.

22 Claims, 8 Drawing Sheets

CLASS AB OUTPUT STAGES AND AMPLIFIERS INCLUDING CLASS AB OUTPUT STAGES

PRIORITY CLAIM

This application claims priority under 35 U.S.C. 119(e) to U.S. Provisional Patent Application No. 61/355,026, entitled CLASS AB OUTPUT STAGES AND AMPLIFIERS INCLUDING CLASS AB OUTPUT STAGES, filed Jun. 15, 2010, and U.S. Provisional Application No. 61/381,881, entitled CLASS AB OUTPUT STAGES AND AMPLIFIERS INCLUDING CLASS AB OUTPUT STAGES, filed Sep. 10, 2010, each of which is incorporated herein by reference.

BACKGROUND

Class AB output stages, such as unity gain buffers, are used in various different circuits, e.g., to provide output buffers for an operational amplifier. Preferably, such unity gain buffers have low distortion, so that a low distortion operational amplifier can be achieved. In some unity gain buffer designs, where both NPN and PNP bipolar junction transistors have been available, unity gain buffers have been successfully implemented as a cascaded complementary bipolar emitter follower—often known as the '0002' follower or 'diamond' follower.

Presently, the highest performance complementary bipolar processes, such as the Silicon Germanium BiCMOS process, are not readily available for producing complementary process bipolar junction transistors (i.e., both NPN and PNP transistors) in open market foundry bipolar processes. In any case, the NPN transistors available in open market foundry bipolar processes out-perform the complementary process transistors.

SUMMARY

Specific embodiments of the present invention are directed to a buffer stage that includes a flipped voltage follower and an emitter follower. The flipped voltage follower is connected between a high voltage rail and a low voltage rail and includes an input and an output. The emitter follower is also connected between the high voltage rail and the low voltage rail and includes an input and an output. A resistor connects the output of the flipped voltage follower to the output of the emitter follower. The input of the flipped voltage follower and the input of the emitter follower are connected together and provide an input of the buffer stage. The output of the emitter follower provides an output of the buffer stage. The buffer stage operates as a class AB unity gain amplifier.

In accordance with an embodiment, the flipped voltage follower and the emitter follower each comprise transistors of the same type, but neither comprise transistors of the opposite type. For example, the flipped voltage follower and the emitter follower each comprise NPN transistors, but neither comprise PNP transistors. Alternatively, the flipped voltage follower and the emitter follower can each comprise PNP transistors, but neither comprise NPN transistors.

The buffer stage can also include a bias generator configured to bias at least one transistor of the flipped voltage follower and at least one transistor of the emitter follower. In accordance with an embodiment, the bias generator is implemented as a DC level shifter.

Specific embodiments of the present invention are directed to a differential buffer stage that includes a pair of buffers. The first buffer accepts a first input signal, and the second buffer that accepts a second input signal. Each of the first and second buffers includes a flipped voltage follower, and an emitter follower, connected in the manner described above. Additionally, the first buffer can include a bias generator configured to bias transistors within the first buffer, and the second buffer can include its own bias generator configured to bias transistors within the second buffer.

Specific embodiments of the present invention are directed to a fully differential operational amplifier including a transconductance stage, a differential output buffer stage, and a voltage gain stage. The transconductance stage provides differential inputs for the operation amplifier. The differential output buffer stage, which includes first and second buffers, provide differential outputs for the operation amplifier. The voltage gain stage is between the transconductance stage and the differential output buffer stage. Each of the first and second buffers includes a flipped voltage follower, and an emitter follower, connected in the manner described above. Additionally, the first buffer can include a bias generator configured to bias transistors within the first buffer, and the second buffer can include its own bias generator configured to bias transistors within the second buffer.

This summary is not intended to summarize all of the embodiments of the present invention. Further and alternative embodiments, and the features, aspects, and advantages of the embodiments of invention will become more apparent from the detailed description set forth below, the drawings and the claims.

DETAILED DESCRIPTION

Figure 1:
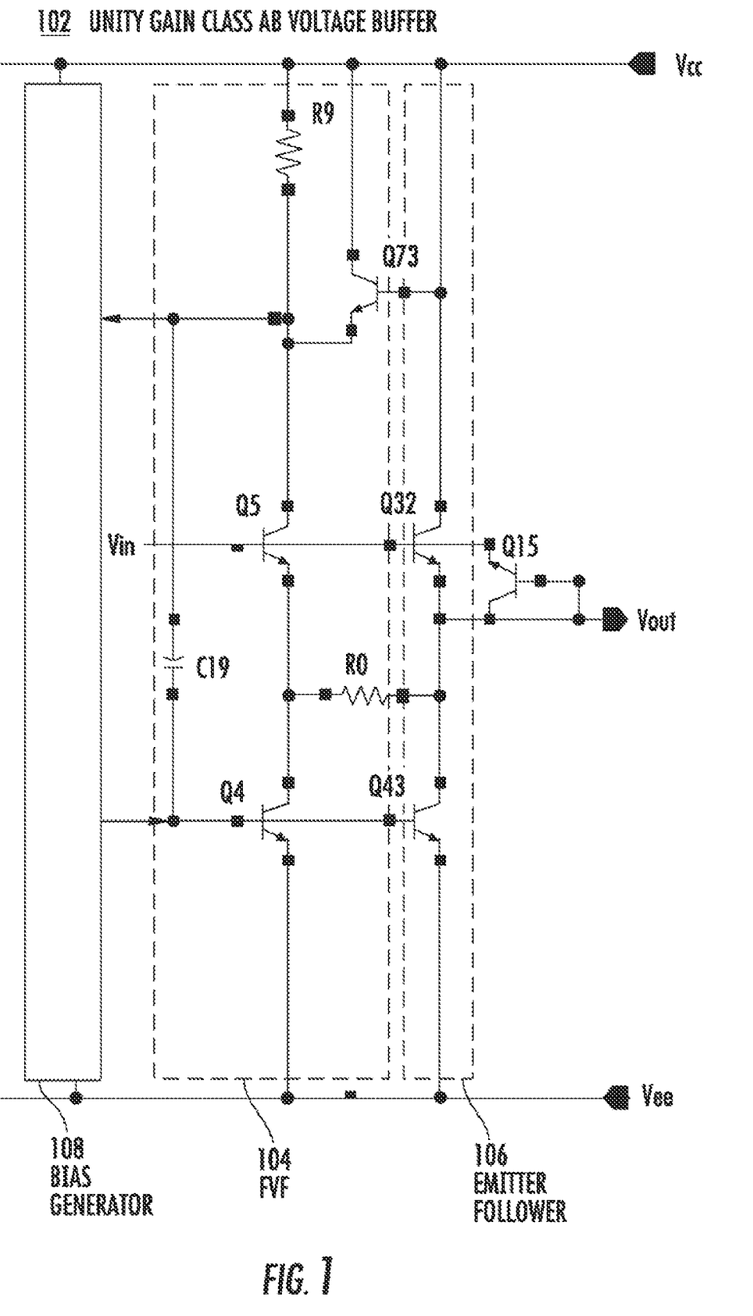
FIG. 1 illustrates a class AB unity gain buffer according to an embodiment of the present invention.

Certain embodiments of the present invention are directed to a fast, low distortion unity gain voltage buffer implemented using NPN transistors, without any PNP transistors. FIG. 1 illustrates a class AB unity gain buffer 102 according to an embodiment of the present invention, which will often be referred to hereafter simply as the buffer 102. As shown in FIG. 1, the buffer 102 includes a flipped voltage follower (FVF) 104 and an emitter follower 106 connected in parallel between a high voltage rail (Vcc) and a low voltage rail (Vee). Additionally, the buffer 102 is shown as including a bias generator 108 that provides a bias output to the FVF 104 and the emitter follower 106.

The FVF 104, which is sometimes also referred to as a "white follower," is shown as including a pair of NPN transistors Q4 and Q5, with the collector of transistor Q5 connected (in an embodiment, by a capacitor C19) to the base of transistor Q4. A resistor R9 is connected between the collector of transistor Q5 and the high voltage rail (Vcc) to provide a current source for the FVF 104. The emitter of transistor Q4 is connected to the low voltage rail (Vee). The base of the transistor Q5 provides the input of the FVF 104. The emitter of transistor Q5 provides the output of the FVF 104. The capacitor C19 couples the high frequency components of the collector voltage of transistor Q5 to the base of transistor Q4, while blocking the low frequency components. The capacitor C19 also provides additional transient or AC current for sinking load current by driving the bases of transistors Q4 and Q43. Additionally, the base of transistor Q4 receives the output of the bias generator 108. In an embodiment, the bias generator 108 accepts at an input the voltage at the collector of transistor Q5, and passes the low frequency components of the collector voltage of transistor Q5 on to the base of transistor Q4.

When the voltage signal at the input of the FVF 104 (i.e., the base of transistor Q5) increases, there is an increase in the emitter current of transistor Q5 due to the finite impedance at that node. This current is also apparent in the collector terminal of transistor Q5 and passes through the resistor R9. This results in the voltage at the collector of transistor Q5 decreasing. This voltage at the collector of transistor Q5 propagates through the capacitor C19 to the base of transistor Q4, which causes the collector current of transistor Q4 to decrease, which in turn lowers the collector current of transistor Q5. When the voltage signal at the input of the FVF 104 (i.e., the base of transistor Q5) decreases, there is a decrease in the collector current of transistor Q5 and a decrease in the current through the resistor R9. This results in the voltage at the collector of transistor Q5 increasing. This voltage at the collector of transistor Q5 propagates through the capacitor C19 to the base of transistor Q4, which causes the collector current of transistor Q4 to increase, which in turn increases the collector current of transistor Q5. More generally, a negative feedback loop is formed by transistor Q5, capacitor C19, and transistor Q4, which results in changes in the collector current of transistor Q5 causing an opposing change in the collector current of transistor Q4. This negative feedback loop tends to keep the collector current of transistor Q5 substantially constant and therefore the base-emitter voltage (VBE) of transistor Q5 substantially constant, which provides for a low distortion circuit.

The emitter follower 106 includes NPN transistors Q32 and Q43. The collector of transistor Q32 is connected to the high voltage rail (Vcc). The base of transistor Q32 provides the input of the emitter follower 106. The emitter of transistor Q32, which provides the output of the emitter follower 106, is connected to the collector of transistor Q43. The emitter of transistor Q43 is connected to the low voltage rail to provide a current sink for the emitter follower 106. The base of transistor Q43 is connected to the base of transistor Q4, causing them both to be biased in the same manner by the feedback signal through capacitor C19 and the bias output of the bias generator 108.

The input of the FVF 104 and the input of the emitter follower 104 are connected together to provide the input (Vin) of the buffer 102. A low value resistor R0 is connected in series between the output of the FVF 104 and the output of the emitter follower 106. The resistor R0 increases the impedance of the FVF 104, and is used to equalize the output impedances of the FVF 104 and the emitter follower 106. Equalizing the output impedances of the parallel follower stages is a key feature of the design to provide low distortion. With equal output impedances, the collector currents of transistors Q5 and Q32 are equal. This allows the feedback from transistor Q5 in the FVF 104 to be used to compensate changes in the collector current of transistor Q32. This is accomplished in the design by connecting the base of transistor Q43 to the base of transistor Q4, so that the collector current of Q43 replicates the collector current of Q4. This reduces the variation in the collector current of transistor Q32, resulting in a low distortion from the emitter follower 106. This also allows the outputs of the FVF 104 and emitter follower 106 to be appropriately summed together at the output (Vout) of the buffer 102.

The bias generator 108 produces a bias output that is used to bias the bases of transistors Q4 and Q43 at low frequencies. In accordance with an embodiment, the bias output is a bias current. In accordance with an embodiment, the bias generator 108 is implemented as a DC level shifter that accepts the voltage at the collector of transistor Q5 and shifts it down to another voltage level that is used to provide the bias output (e.g., a bias current is proportional to the shifted down voltage level). In accordance with an embodiment, the DC level shifter is between the collector of transistor Q5 and the base of transistor Q4 and uses an emitter follower Q29 and PMOS common gate stage M10 to make an 'elastic' level shift, as can be appreciated from FIG. 2 discussed below. In accordance with an embodiment, the entire level shifter is bypassed by the capacitor C19 at high frequencies.

Also shown in FIG. 1 are optional transistors Q15 and Q73 which provide circuit protection for the buffer 102. Transistor Q15 limits the reverse bias of the base-to-emitter voltages of transistors Q32 and Q5, to protect transistors Q32 and Q5 from damage. Transistor Q73 limits the voltage swing across the resistor R9, which prevents large transients on the collector of transistor Q5 that could turn off the bias current to the bases of transistors Q4 and Q43.

As can be appreciated from FIG. 1, all of the bipolar junction transistors are NPN transistors. Accordingly, the FVF 104 and the emitter follower 106 can be referred to as N-type sub-stages. In operation, the N-type FVF 104 can pull down more current than it can pull down, and the N-type emitter follower 106 can pull up more current than it can pull up. Stated another way, the N-type FVF 104 can sink current strongly, but cannot source a current greater than its load resistor or current source can source. The N-type emitter follower 106 can source current strongly, but cannot sink a current greater than its pull down transistor or current sink can sink. Accordingly, the N-type FVF 104 can be said to have negative asymmetry, and the N-type emitter follower 106 can be said to have positive asymmetry. The parallel connection of the FVF 104 and the emitter follower 106 provide class AB operation when both sourcing and sinking current. In other words, the FVF 104 and the emitter follower 106 provide a push-pull class AB operation. If the FVF and emitter follower were P-type, would this be opposite, i.e., the P-type FVF would pull up more than it can pull down, and the P-type emitter follower would pull down more than it can pull up.

Figure 2:
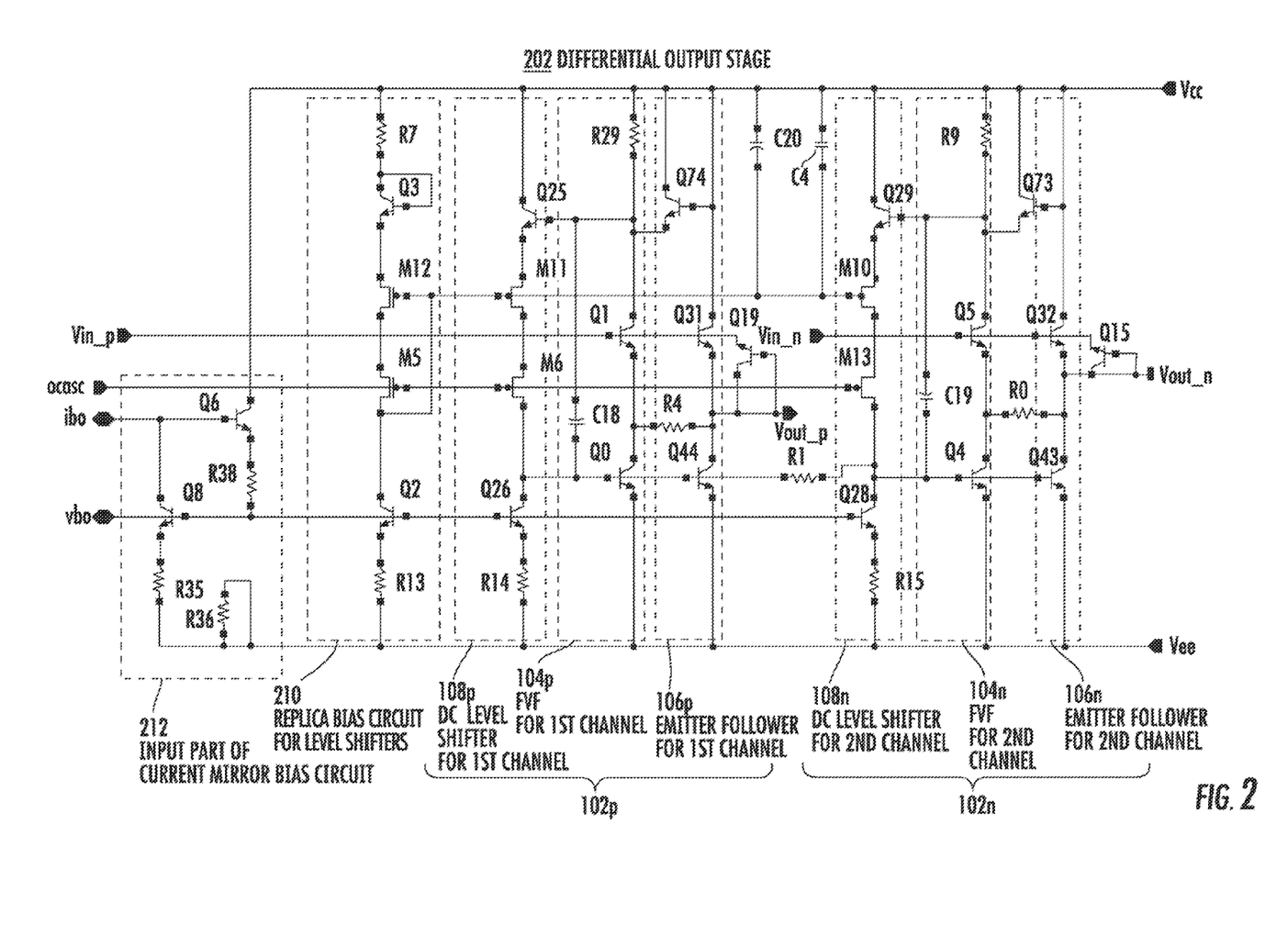
FIG. 2 illustrates a differential output stage according to an embodiment of the present invention.

FIG. 2 illustrates how two buffers 102 (labeled 102p and 102n) can be connected with a bias circuit and a differential gain resistor, in accordance with an embodiment of the present invention, to provide a differential output stage 202. The buffer 102p receives a first input signal at Vin_p, and the buffer 102n receives a second input signal at Vin_n. The buffer 102p provides a first output at Vout_p, and the buffer 102n provides a second output at Vout_n.

The buffer 102n is an implementation of the buffer 102 described above with reference to FIG. 1, with the transistors and resistors connected and labeled in the same manner. In FIG. 2, the bias generator 108n is implemented as a DC voltage level shifter including NPN transistors Q29 and Q28, PMOS transistors M10 and M13, and resistor R15. The emitter follower Q29 of the bias generator 108n drives the source of transistor M10, which acts as a common gate amplifying stage. Transistor M13 is a cascode transistor, which increases the output impedance of the level shifter. The cascode transistor M13 also reduces the drain to source voltage of transistor M10, allowing both transistors M10 and M13 to be lower voltage MOS transistors that would not be capable of withstanding the full supply voltage. This results in a circuit that can be operated from a 5.5 volt supply, even though the individual MOSFETS can only withstand 3.6 volts.

The buffer 102p is similar to the buffer 102n in that it includes a FVF 104p, an emitter follower 106p and a bias generator 108p implemented as a DC voltage level shifter. The FVF 104p includes NPN transistors Q0 and Q1, a resistor R29 and a capacitor C18 (which operate in a similar manner as transistors Q4 and Q5, the resistor R9, and the capacitor C19). The emitter follower 106p includes NPN transistors Q31 and Q44 (which operate in a similar manner as transistors Q32 and Q43). The resistor R4 provides the same function for the buffer 102p that the resistor R0 does for the buffer 102n. The bias generator 108p is implemented as a DC voltage level shifter including NPN transistors Q25 and Q26, PMOS transistors M6 and M11, and resistor R14 (which operate in similar manners as transistors Q28 and Q29, PMOS transistors M10 and M13, and resistor R15). Optional transistors Q19 and Q74 shown in FIG. 2 provide similar circuit protection as transistors Q15 and Q73 discussed with reference to FIG. 1, and also included in FIG. 2.

Also shown is a replica bias circuit 210 for the level shifters. The replica bias circuit 210 is shown as including NPN transistors Q2 and Q3, PMOS transistors M5 and M12, and resistors R7 and R13. A control voltage is generated at the gate of transistor M12 by the voltage drop across resistor R7, transistor Q3 and transistor M12. The bias current through these devices is the same as that through transistor M11 and transistor Q25 in the level shifter 108p, and through transistor M10 and transistor Q29 in the level shifter 108n. Accordingly, the voltage across resistors R29 and R9 is made substantially equal to the voltage across resistor R7. This controls the quiescent bias current in the both the FVF and the emitter followers. Also shown is an input part of a current mirror bias circuit 212, which is shown as including NPN transistors Q6 and Q8, and resistors R35, R36 and R38. This generates the equal collector currents in transistors Q2, Q26 and Q28. The bias generators 108n, 108p, the replica bias circuit 210 and the input part of the current mirror bias circuit 212 can all be considered bias circuitry.

There are contradictory requirements on the level shifters used with the flipped voltage followers, as they are responsible for both signal transmission at low frequency and for defining the operating bias current of the flipped voltage followers. Unity gain is desirable for signal transmission, but a higher gain is desirable to reduce errors in the output stage bias current. The resistor R1 addresses this problem. This resistor R1 links the level shifters 108p and 108n. The value of resistor R1 is chosen such that level shifters 108p, 108n and the resistor R1 have a differential voltage gain near one. This matches the differential voltage gain of the low frequency path through the level shifters to that of the high frequency path through capacitors C18 and C19. This improves the operation of the differential output stage at low frequencies. The common mode gain of the level shifters remains high, which improves the control of the bias current in the output stage.

Figure 3:
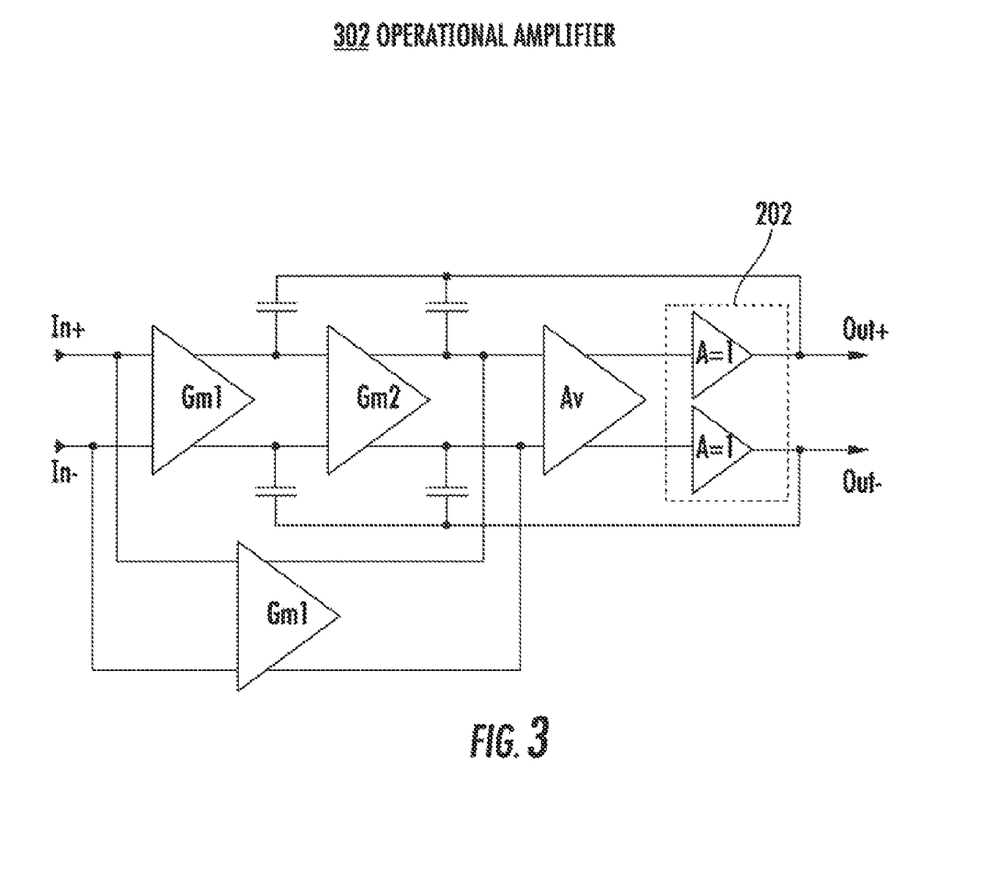
FIG. 3 shows an exemplary operational amplifier including the differential output stage of FIG. 2.

FIG. 3 shows an exemplary operational amplifier 302 that includes the unity gain buffers 102n and 102p described above, and more specifically, the differential output stage 202. The operation amplifier 302 is shown as a fully differential three stage nested miller amplifier with feed-forward, with the addition of voltage buffers 102n and 102p (shown collectively as stage 202 in FIG. 3) at the output. These buffers are voltage followers with internal loop gain. The Av stage is a voltage gain stage, and all the preceding Gm stages are transconductance stages based on differential pairs. In accordance with an embodiment, the overall unity gain bandwidth is about 16 GHz. In accordance with an embodiment, Gm2 has ⅕th the transconductance of the two input stages, setting the cross-over between three stage and two stage operation at 3.2 GHz. Over the operating frequency range of 1 to 250 Mhz, there are a total of 4 nested feedback loops in action: 1) the internal feedback in the unity gain output buffers; 2) the inner miller feedback loop around the voltage gain stage; 3) the outer miller feedback loop around the voltage gain stage and Gm2; and 4) the off chip feedback loop which sets the desired gain. In accordance with an embodiment, above 3.2 GHz the 3 stage path has no gain, and the frequency response is set by the two stage path. FIG. 3 shows just one example of how the unity gain buffer 102 (describe with reference to FIG. 1) and the differential output stage 202 (described with reference to FIG. 2) can be used to provide the output stage for an operational amplifier. While exemplary details of the transconductance stages, voltage gain stage, feedback loops, and the like, for an operation amplifier are shown in FIG. 3, one of ordinary skill in the art would understand that the unity gain buffer 102 and the differential output stage 202 can be used to provide the output stage for almost any operational amplifier (and more generally, any amplifier) and still be within the scope of the present invention.

Figure 4:
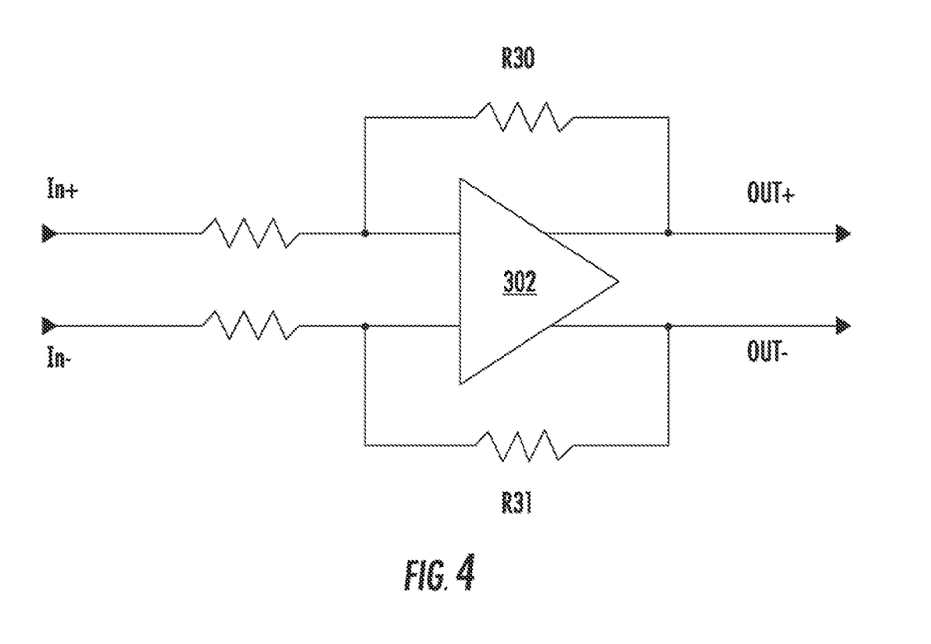
FIG. 4 shows the operational amplifier of FIG. 3 connected in a fully differential amplifier (FDA) configuration.
Figure 5:
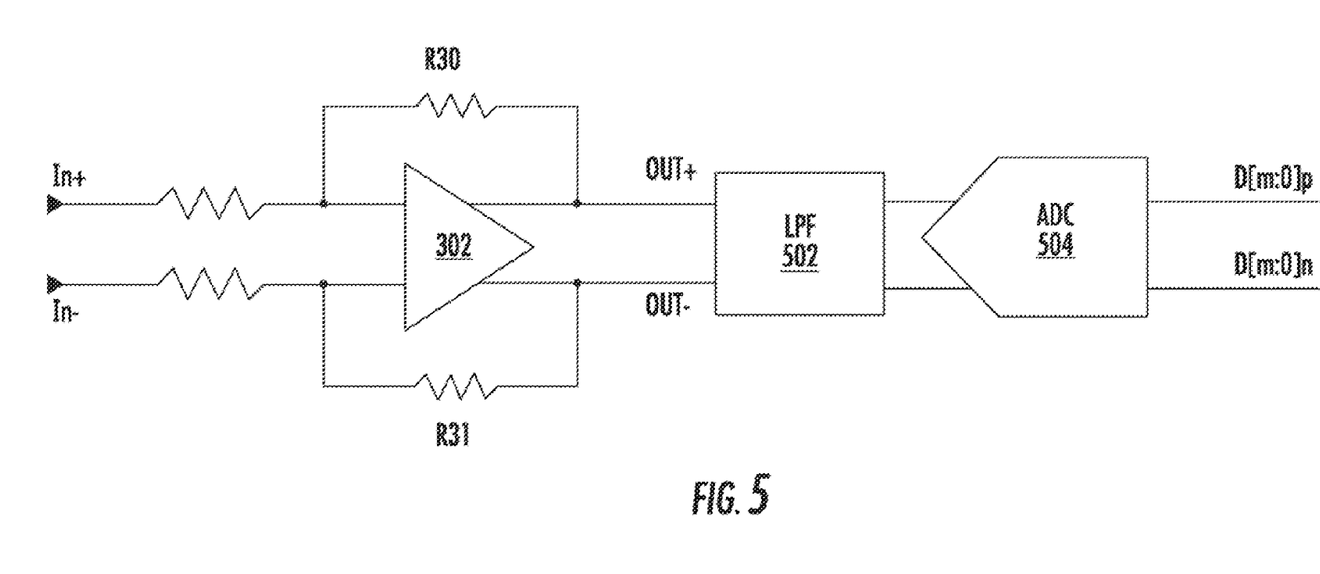
FIG. 5 shows an exemplary system that implements embodiments of the present invention.

FIG. 4 shows the amplifier 302 connected in a fully differential amplifier (FDA) configuration. FIG. 5 shows an exemplary system that implements embodiments of the present invention. More specifically, FIG. 5 shows the amplifier 302 connected in a fully differential amplifier (FDA) configuration being used to drive an analog to digital (ADC) converter 504, according to an embodiment of the present invention. Additionally, a low pass filter 502 is shown as being used to filter the output of the amplifier 302 before it is provided to the ADC 504.

In accordance with certain embodiments of the present invention, the circuits 102 and 202 are manufactured using Silicon Germanium BiCMOS process technology. Alternatively, other types of process technology can be used.

As mentioned above, Silicon Germanium BiCMOS NPN transistors (but not PNP transistors) are currently available in open market foundry bipolar processes. Accordingly, the circuits described above can be produced using Silicon Germanium BiCMOS NPN transistors currently available in open market foundry bipolar processes. Additionally, NPN transistors typically outperform their PNP counterparts. Thus, the circuits described above, by including NPN transistors, but not PNP transistors, provide for excellent performance. Nevertheless, it is still within the scope of the present invention for the circuits described above to be essentially be flipped, which includes replacing the NPN transistors with PNP transistors, and replacing PMOS transistors with NMOS transistors. It is also within the scope of this invention to replace the NPN bipolar devices with other amplifying devices, such as field effect transistors.

Classic class AB complementary bipolar 'diamond' or '0002' follower amplifiers include followers that are the mirror images of one another, with each follower including opposing types of bipolar junction transistors (i.e., both NPN and PNP transistors) in similar configurations. By contrast, in accordance with specific embodiments of the present invention described above, the followers of the class AB buffer stage include only a single type of bipolar junction transistors (i.e., only NPN, or only PNP transistors).

Referring back to FIG. 1, the buffer stage 102 was shown as including an N-type flipped voltage follower (FVF) 104 and an N-type emitter follower 106, each of which is connected between a high voltage rail and a low voltage rail. The N-type emitter follower 106 is an example of a follower with positive asymmetry, i.e., it pulls up more than it pulls down. The N-type FVF 104, on the other hand, is an example of a follower with negative asymmetry, i.e., it pulls down more than it pulls up. It is also within the scope of the present invention that an alternative follower with positive asymmetry, can be used in place of an N-type emitter follower, and/or an alternative type of follower with negative asymmetry can be used in place of an N-type FVF.

Figure 6:
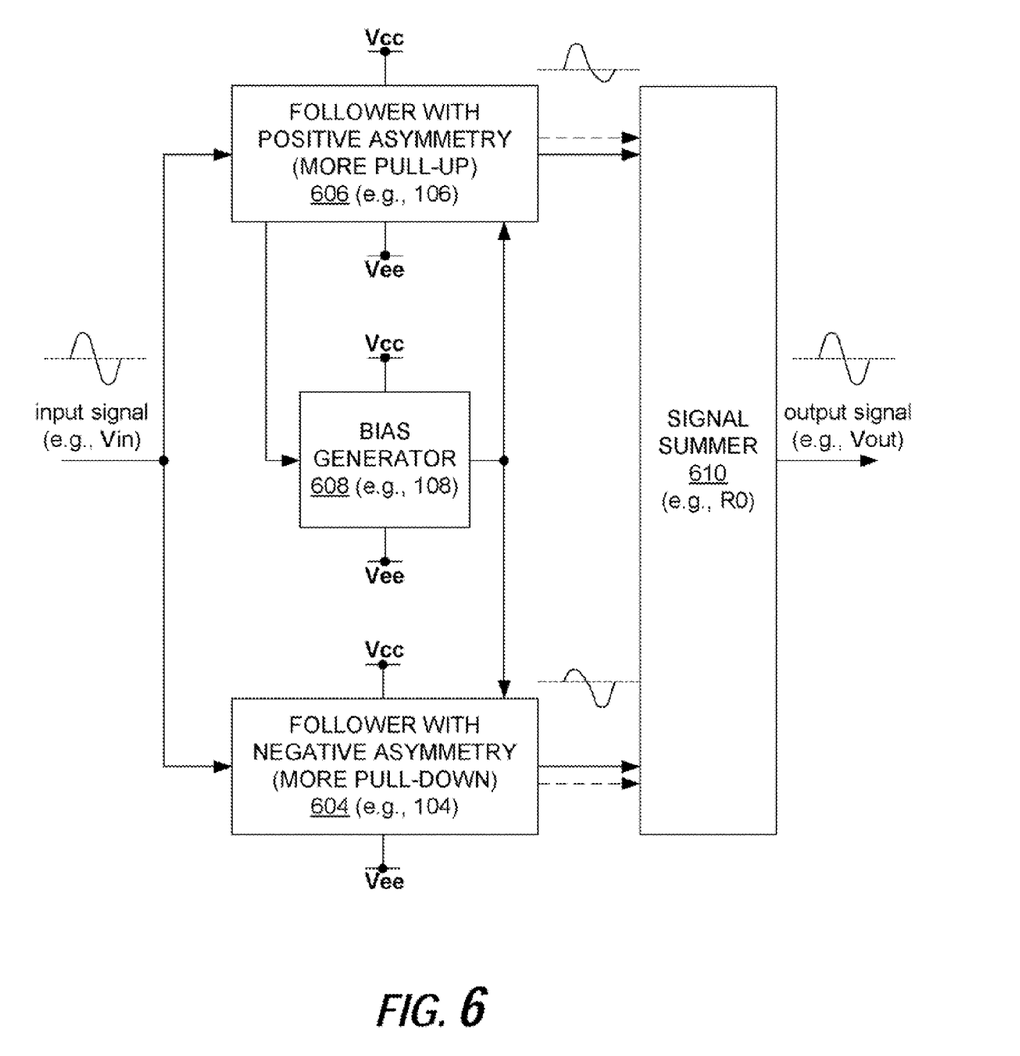
FIG. 6 is a high level block diagram of a class AB unity gain buffer according to an embodiment of the present invention.

As shown in FIG. 6, an input signal (e.g., Vin) is provided to both a follower with positive asymmetry (i.e., it pulls up more than it pulls down) represented by block 606, and a follower with negative asymmetry (i.e., it pulls down more than it pulls up) represented by block 604. Stated another way, the gain of block 606 is greater for positive portions of a signal than for negative portions of the signal, and the gain of block 604 is greater for negative portions of a signal than for positive portions of the signal. Block 604 can be implemented by the N-type FVF 104, but is not limited thereto. Block 606 can be implemented by the N-type emitter follower 106, but is not limited thereto. If the FVF 104 and emitter follower 106 were implemented using P-type transistors (instead of N-type transistors), then block 604 can be implemented by the P-type emitter follower 106, and block 606 can be implemented by the P-type FVF 104. FIG. 6 also shown a bias generator 608, which can be implemented by bias generator 108, but is not limited thereto.

The follower with positive asymmetry 606 receives the input signal and amplifies positive portions of the input signal more than negative portions of the input signal, to thereby generate an output signal (having positive asymmetry relative to the input signal). The follower with negative asymmetry 604 receives the same input signal and amplifies negative portions of the input signal more than positive portions of the input signal, to thereby generate an output signal (having negative asymmetry relative to the input signal). Such amplification can be unity gain amplification or less, but is not limited thereto. In other words, the term amplifies, as being used herein, does not necessarily imply an increase in amplitude. The signal summer 610 sums the signal produced by the follower with positive asymmetry 604, and the signal produced by the follower with negative asymmetry 606, to thereby produce the output signal, which is symmetric relative to the input signal. The signal summer 610 can also match the output impedances of the follower with positive asymmetry 606 and the follower with negative asymmetry 604. In accordance with an embodiment, the output signal is substantially identical to the input signal, i.e., the output signal is a buffered version of the input signal.

Figure 7:
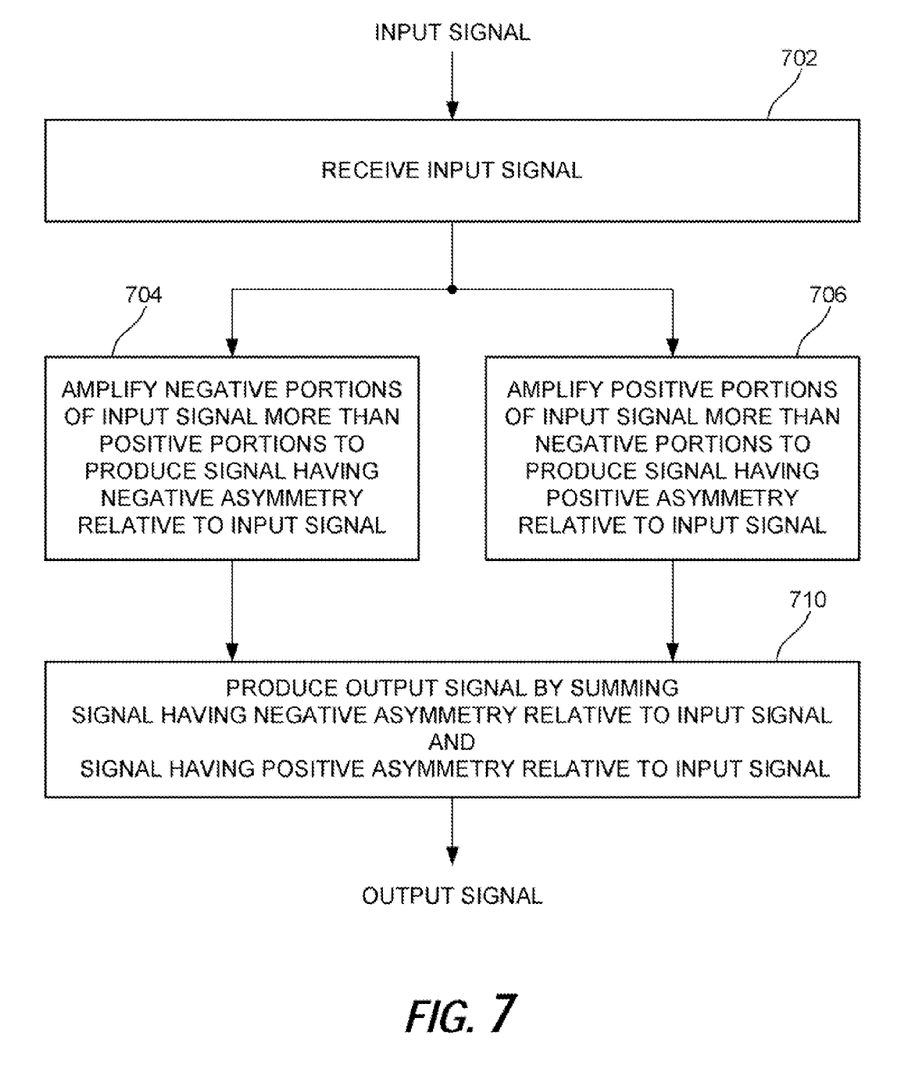
FIG. 7 is a high level flow diagram that is used summarize methods in accordance with certain embodiments of the present invention.

Methods, in accordance with specific embodiments of the present invention, are summarized in the high level flow diagram of FIG. 7. Referring to FIG. 7, at a step 702, an input signal is receive. In certain embodiments, the input signal received at step 702 is receive at an input of a first follower (e.g., 606 or 106) and an input of a second follower (e.g., 604 or 104), wherein the first and second followers are connected in parallel and the inputs of the first and second followers are connected together. At step 704, positive portions of the input signal are amplified more than negative portions of the input signal, using the first follower (e.g., 606 or 106), to produce a signal having positive asymmetry relative to the input signal. At step 706, negative portions of the input signal are amplified more than positive portions of the input signal, using the second follower (e.g., 604 of 104), to produce a signal having negative asymmetry relative to the input signal. At step 710, the signal having positive asymmetry relative to the input signal (produced at step 702) is summed with the signal having negative asymmetry relative to the input signal (produced at step 706) to thereby produce an output signal. In accordance with an embodiment, the output signal produced at step 710 is substantially identical to the input signal received at step 702, i.e., the output signal is a unity gain buffered version of the input signal. In accordance with specific embodiments, the amplifying performed at steps 704 and 706 are performed using followers that comprise bipolar junction transistors of the same type, without comprising bipolar junction transistors of the opposite type (i.e., only NPN transistors, or only PNP transistors).

Figure 8:
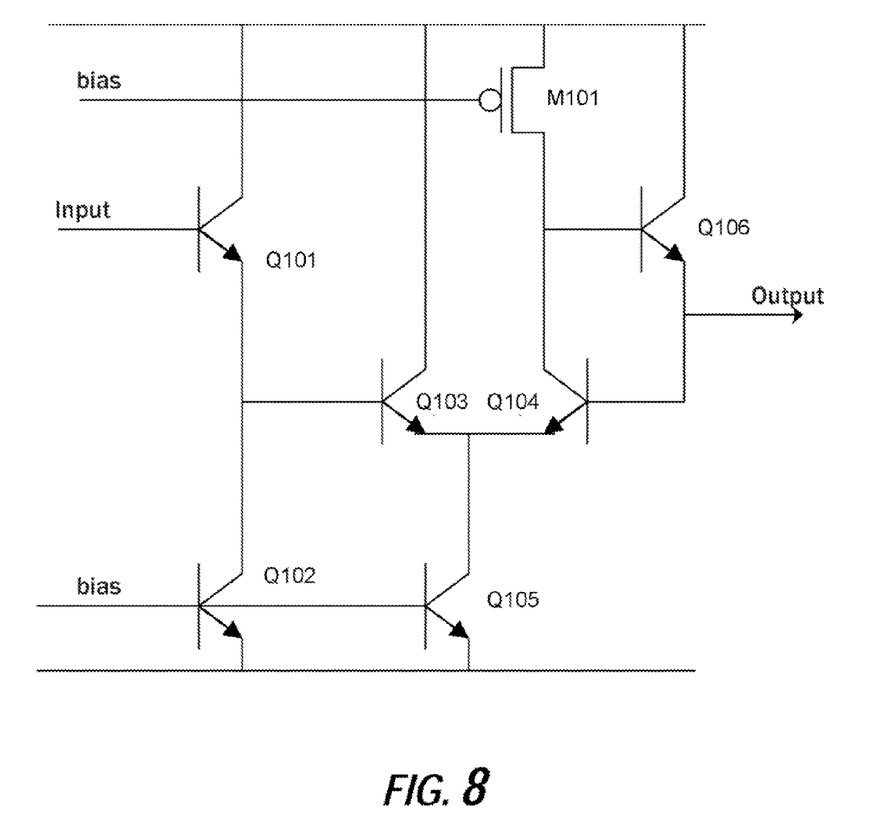
FIG. 8 illustrates an example of an alternative follower having positive asymmetry.

As was mentioned above, the N-type emitter follower 106 is an example of a follower with positive asymmetry 606 that amplifies positive portions of an input signal more than negative portions of the input signal, to thereby generate an output signal (having positive asymmetry relative to the input signal). FIG. 8 illustrates an alternative follower with positive asymmetry 604, which includes feedback. This circuit uses an auxiliary amplifier including transistors Q101, Q103 and Q104 to drive an emitter follower Q106. Transistors Q3 and Q4 are a differential pair providing feedback gain around the emitter follower Q6. Transistor M101 functions as a current source, and could be replaced by an alternative, such as a resistor. Transistor Q1 is a level shifter which provides the correct voltage difference between the input and output so that this circuit can be placed in parallel with a FVF. The extra loop gain of the auxiliary amplifier improves the linearity of this stage by feedback.

Embodiments of the present invention have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art, and are within the scope of the present invention.

Embodiments were chosen and described in order to best describe the principles of the invention and its practical application, thereby enabling others skilled in the art to understand the invention. It is intended that the scope of the invention be defined by the following claims and their equivalents.

What is claimed is:

1. A buffer stage, comprising:
   a flipped voltage follower connected between a high voltage rail and a low voltage rail and including an input and an output;
   an emitter follower connected between the high voltage rail and the low voltage rail and including an input and an output; and
   a resistor connecting the output of the flipped voltage follower to the output of the emitter follower;

wherein the input of the flipped voltage follower and the input of the emitter follower are connected together and provide an input of the buffer stage; and wherein the output of the emitter follower provides an output of the buffer stage.

2. The buffer stage of claim 1, wherein the resistor equalizes output impedances of the flipped voltage follower and the emitter follower and causes outputs of the flipped voltage follower and the emitter follower to be summed at the output of the buffer stage.

3. The buffer stage of claim 1, wherein:
the flipped voltage follower and the emitter follower each comprise bipolar junction transistors of the same type, but neither comprise bipolar junction transistors of the opposite type.

4. The buffer stage of claim 3, wherein:
the flipped voltage follower and the emitter follower each comprise NPN transistors, but neither comprise PNP transistors.

5. The buffer stage of claim 3, wherein:
the flipped voltage follower and the emitter follower each comprise PNP transistors, but neither comprise NPN transistors.

6. The buffer stage of claim 1, further comprising:
a bias generator configured to bias at least one transistor of the flipped voltage follower and at least one transistor of the emitter follower.

7. The buffer stage of claim 6, wherein the bias generator comprises a DC level shifter.

8. The buffer stage of claim 1, wherein the flipped voltage follower comprises:
a first transistor (Q5) having a base that provides the input of the flipped voltage follower, a collector connected by a first resistor (R9) to a high voltage rail (Vcc), and an emitter that provides the output of the flipped voltage follower; and
a second transistor (Q4) having a base, a collector connected to the emitter of the first transistor (Q5), and an emitter connected to a low voltage rail (Vee).

9. The buffer stage of claim 8, wherein the flipped voltage follower further comprises:
a capacitor (C19) connected between the collector of the first transistor (Q5) and the base of the second transistor (Q4).

10. The buffer stage of claim 9, further comprising:
a bias generator configured to bias the base of the second transistor (Q4).

11. The buffer stage of claim 9, wherein the emitter follower comprises:
a third transistor (Q32) having a base that provides the input of the emitter follower, a collector connected to the high voltage rail (Vcc), and an emitter that provides the output of the emitter follower; and
a fourth transistor (Q43) having a base connected to the base of the second transistor (Q4), a collector connected to the emitter the third transistor (Q32), and having an emitter connected to the low voltage rail (Vee).

12. The buffer stage of claim 11, further comprising:
a bias generator configured to bias the base of the second transistor (Q4) and the base of the fourth transistor (Q43).

13. The buffer stage of claim 1, wherein the buffer stage operates as a class AB unity gain amplifier.

14. A differential buffer stage, comprising:
a first buffer that accepts a first input signal; and
a second buffer that accepts a second input signal;
wherein each of the first and second buffers includes
a flipped voltage follower, including an input and an input, and connected between a high voltage rail and a low voltage rail;
an emitter follower, including an input and an output, and connected between the high voltage rail and the low voltage rail; and
a resistor connecting the output of the flipped voltage follower to the output of the emitter follower;
wherein the input of the flipped voltage follower and the input of the emitter follower are connected together and provide an input of the buffer stage; and
wherein the output of the emitter follower provides an output of the buffer stage.

15. The differential buffer stage of claim 14, wherein:
the flipped voltage follower and the emitter follower of the first buffer, and the flipped voltage follower and the emitter follower of the second buffer, each comprise bipolar junction transistors of the same type, but neither comprise bipolar junction transistors of the opposite type.

16. The differential buffer stage of claim 14, wherein:
the first buffer also includes a bias generator configured to bias at least one transistor of the flipped voltage follower and at least one transistor of the emitter follower of the first buffer; and
the second buffer also includes a bias generator configured to bias at least one transistor of the flipped voltage follower and at least one transistor of the emitter follower of the second buffer.

17. A fully differential operational amplifier, comprising:
a transconductance stage that provides differential inputs for the operation amplifier;
a differential output buffer stage including first and second buffers that provide differential outputs for the operation amplifier; and
wherein each of the first and second buffers of the differential output buffer stage includes
a flipped voltage follower, including an input and an input, and connected between a high voltage rail and a low voltage rail;
an emitter follower, including an input and an output, and connected between the high voltage rail and the low voltage rail; and
a resistor connecting the output of the flipped voltage follower to the output of the emitter follower;
wherein the input of the flipped voltage follower and the input of the emitter follower are connected together and provide an input of the buffer stage; and
wherein the output of the emitter follower provides an output of the buffer stage.

18. The fully differential operational amplifier of claim 17, further comprising a voltage gain stage between the transconductance stage and the differential output buffer.

19. The differential buffer stage of claim 15, wherein:
the flipped voltage follower and the emitter follower of the first buffer, and the flipped voltage follower and the emitter follower of the second buffer, each comprise NPN transistors, but neither comprise PNP transistors.

20. The differential buffer stage of claim 15, wherein:
the flipped voltage follower and the emitter follower of the first buffer, and the flipped voltage follower and the emitter follower of the second buffer, each comprise PNP transistors, but neither comprise NPN transistors.

21. The fully differential operational amplifier of claim 17, wherein:
the flipped voltage follower and the emitter follower of the first buffer, and the flipped voltage follower and the emitter follower of the second buffer, each comprise NPN transistors, but neither comprise PNP transistors.

22. The fully differential operational amplifier of claim 17, wherein:

the flipped voltage follower and the emitter follower of the first buffer, and the flipped voltage follower and the emitter follower of the second buffer, each comprise PNP transistors, but neither comprise NPN transistors.

* * * * *